US010411222B2

(12) United States Patent
Hu et al.

(10) Patent No.: US 10,411,222 B2
(45) Date of Patent: Sep. 10, 2019

(54) TRANSPARENT HYBRID SUBSTRATES, DEVICES EMPLOYING SUCH SUBSTRATES, AND METHODS FOR FABRICATION AND USE THEREOF

(71) Applicant: University of Maryland, College Park, College Park, MD (US)

(72) Inventors: Liangbing Hu, Potomac, MD (US); Yonggang Yao, College Park, MD (US); Tian Li, Silver Springs, MD (US)

(73) Assignee: University of Maryland, College Park, College Park, MD (US)

( * ) Notice: Subject to any disclaimer, the term of this patent is extended or adjusted under 35 U.S.C. 154(b) by 0 days.

(21) Appl. No.: 15/987,634

(22) Filed: May 23, 2018

(65) Prior Publication Data
US 2018/0342702 A1    Nov. 29, 2018

Related U.S. Application Data

(60) Provisional application No. 62/510,033, filed on May 23, 2017.

(51) Int. Cl.
*H01L 51/52*    (2006.01)
*H01L 29/786*   (2006.01)
(Continued)

(52) U.S. Cl.
CPC .... *H01L 51/5268* (2013.01); *H01L 29/78603* (2013.01); *H01L 31/0547* (2014.12);
(Continued)

(58) Field of Classification Search
CPC ........... H01L 29/78603; H01L 31/0547; H01L 51/0097; H01L 51/5268
See application file for complete search history.

(56) References Cited

U.S. PATENT DOCUMENTS 3,749,604 A * 7/1973 Langer et al. ...... H01M 2/1653
                                                429/136
3,915,202 A * 10/1975 Curtis ................ D03D 15/00
                                                139/425 A
(Continued)

FOREIGN PATENT DOCUMENTS

GB    1023576 A  *  3/1966  ............. D21H 19/62
GB    1504369 A  *  3/1978  ............... B44C 1/10
(Continued)

OTHER PUBLICATIONS

Wang et al., Highly stable "pore-filling" tubular composite membrane by self-crosslinkable hyperbranched polymers for toluene/n-heptane separation, Journal of Membrane Science, 474, (2015), 263-272 (Year: 2015).*

(Continued)

*Primary Examiner* — Earl N Taylor
(74) *Attorney, Agent, or Firm* — Shapiro, Gabor and Rosenberger, PLLC (57) ABSTRACT

A porous base substrate is infiltrated with a polymer material to form a hybrid substrate that combines the optical advantages of both. Prior to infiltration, the base substrate may exhibit relatively low optical transmittance. For example, the base substrate may be paper, textiles, aerogels, natural wood, or any other porous material. By infiltrating the base substrate with a polymer having a similar refractive index to that of the material of the base substrate, the transmittance can thus be improved, resulting in, for example, a transparent hybrid substrate that exhibits both relatively high optical haze and relatively high optical transmittance within the visible light spectrum. The hybrid substrate can thus serve as a base for fabricating electronic devices or can be coupled to electronic devices, especially optical devices that can take utilize the unique optical properties of the hybrid substrate.

20 Claims, 8 Drawing Sheets

(51) Int. Cl.
    *H01L 51/00*               (2006.01)
    *H01L 31/054*            (2014.01)
    *H01L 31/0304*          (2006.01)

(52) U.S. Cl.
    CPC ...... *H01L 51/0097* (2013.01); *H01L 31/0304* (2013.01); *H01L 2251/5338* (2013.01)

(56) References Cited

U.S. PATENT DOCUMENTS

| | | | |
|---|---|---|---|
| 3,953,241 A * | 4/1976 | Langer | H01M 2/1653 429/142 |
| 4,149,571 A * | 4/1979 | Burroughs | D21F 1/0027 139/383 A |
| 4,384,961 A * | 5/1983 | Abrams | B01D 37/00 166/267 |
| 5,612,129 A * | 3/1997 | Karhuketo | B27N 3/06 428/221 |
| 5,812,227 A * | 9/1998 | Toshida | C09K 19/544 349/10 |
| 5,928,471 A * | 7/1999 | Howland | B41M 3/14 162/110 |
| 6,265,058 B1 * | 7/2001 | Slenes | H01G 4/20 361/271 |
| 6,592,983 B1 * | 7/2003 | Carson | B32B 3/08 264/122 |
| 8,663,426 B2 * | 3/2014 | Fujiwara | B01D 67/0004 162/157.7 |
| 9,267,237 B2 * | 2/2016 | Hentze | D21F 11/00 |
| 2001/0016249 A1 * | 8/2001 | Kitamura | B41M 5/5218 428/32.34 |
| 2002/0058731 A1 * | 5/2002 | Breton | C09D 11/34 523/160 |
| 2004/0076795 A1 * | 4/2004 | Shimomura | H01G 9/055 428/118 |
| 2004/0246581 A1 * | 12/2004 | Miyatake | G02B 5/0242 359/487.02 |
| 2005/0013984 A1 * | 1/2005 | Dijk | B27N 3/28 428/299.7 |
| 2006/0058188 A1 * | 3/2006 | Tamagawa | B41M 5/40 503/227 |
| 2007/0054223 A1 * | 3/2007 | Kang | G03C 1/74 430/345 |
| 2007/0096078 A1 * | 5/2007 | Lee | B82Y 10/00 257/14 |
| 2007/0205479 A1 * | 9/2007 | Dangel | B81C 3/008 257/432 |
| 2007/0207692 A1 * | 9/2007 | Ono | B01D 39/18 442/327 |
| 2007/0257373 A1 * | 11/2007 | Akram | H01L 21/76898 257/774 |
| 2007/0281136 A1 * | 12/2007 | Hampden-Smith | B41M 1/22 428/195.1 |
| 2008/0049317 A1 * | 2/2008 | Hara | G02B 5/0242 359/487.02 |
| 2008/0078759 A1 * | 4/2008 | Wnek | B32B 7/02 219/730 |
| 2008/0108501 A1 * | 5/2008 | Fujimoto | B32B 27/10 503/227 |
| 2009/0251749 A1 * | 10/2009 | O'Boyle | G03H 1/0252 359/2 |
| 2010/0078066 A1 * | 4/2010 | Darling | H01L 51/4226 136/256 |
| 2011/0117319 A1 * | 5/2011 | Yano | D21H 11/08 428/141 |
| 2012/0019914 A1 * | 1/2012 | Miguez Garcia | G02B 1/005 359/584 |
| 2012/0224897 A1 * | 9/2012 | Qi | B82Y 30/00 399/333 |
| 2012/0298319 A1 * | 11/2012 | Fujiwara | B01D 67/0004 162/100 |
| 2014/0080374 A1 * | 3/2014 | Zhang | B01D 67/0006 442/76 |
| 2014/0127490 A1 * | 5/2014 | Islam | B82Y 30/00 428/219 |
| 2014/0311695 A1 * | 10/2014 | Clark | D21H 13/02 162/145 |
| 2015/0146280 A1 * | 5/2015 | Degott | B05D 3/20 359/298 |
| 2015/0333352 A1 * | 11/2015 | Kikuzumi | H01M 8/1004 429/463 |
| 2015/0376841 A1 * | 12/2015 | Schaede | B32B 27/10 162/124 |
| 2016/0010279 A1 | 1/2016 | Hu et al. | |
| 2016/0200088 A1 * | 7/2016 | Schaede | B32B 38/04 156/108 |
| 2016/0339653 A1 * | 11/2016 | Berthon | B29D 11/00278 |
| 2017/0171968 A1 * | 6/2017 | Heo | B32B 17/064 |
| 2017/0183512 A1 * | 6/2017 | Han | C09D 5/24 |
| 2018/0010299 A1 | 1/2018 | Hu et al. | |
| 2018/0036727 A1 * | 2/2018 | Li | B01L 3/5027 |
| 2018/0102549 A1 * | 4/2018 | Yordem | H01M 4/0407 |
| 2018/0159014 A1 * | 6/2018 | Chiang | H01L 35/32 |
| 2018/0174935 A1 * | 6/2018 | Chong | H01L 23/3107 |
| 2018/0326363 A1 * | 11/2018 | Kim | B01D 69/125 |
| 2018/0326364 A1 * | 11/2018 | Kim | B01D 69/125 |
| 2018/0342702 A1 * | 11/2018 | Hu | H01L 51/5268 |
| 2018/0348900 A1 * | 12/2018 | Heinrich | G06F 3/041 |
| 2018/0370071 A1 | 12/2018 | Boitouzet et al. | |

FOREIGN PATENT DOCUMENTS

| | | | |
|---|---|---|---|
| JP | 2012204396 A * | 10/2012 | |
| WO | WO-2015107488 A1 * | 7/2015 | ....... B29D 11/00278 |
| WO | WO 2017/136714 A1 | 8/2017 | |

OTHER PUBLICATIONS

Yamaguchi et al., A Pore-Filling Electrolyte Membrane-Electrode Integrated System for a Direct Methanol Fuel Cell Application, Journal of The Electrochemical Society, 149, (11), A1448-A1453, (2002) (Year: 2002).*
Tobjörk et al., Paper Electronics, Advanced Materials, 2011, 23, 1935-1961 (Year: 2011).*
Mong et al., Pore-filling polymer electrolyte membrane based on poly (arylene etherketone) for enhanced dimensional stability and reduced methanol permeability, Journal of Membrane Science, 543, (2017), 133-142 (Year: 2017).*
Zhu et al., Transparent nanopaper with tailored optical properties, Nanoscale, 2013, 5, 3787-3792 (Year: 2013).*
Yao et al., Light management in plastic—paper hybrid substrate towards high-performance optoelectronics, Energy Environ. Sci., 2016, 9, 2278-2285 (Year: 2016).*
Yang et al., Three-Dimensional Graphene Network-Based Chemical Sensors on Paper Substrate, Journal of The Electrochemical Society, 160 (9) B160-B163 (2013) (Year: 2013).*
Kim et al., Highly reinforced pore-filling membranes based on sulfonated poly(arylene ether sulfone)s for high-temperature/low-humidity polymer electrolyte membrane fuel cells, Journal of Membrane Science 537 (2017) 11-21 (Year: 2017).*
Zhu et al., Transparent paper: fabrications, properties, and device applications, Energy & Environmental Science, (2013), 20 pages (Year: 2013).*
Ansari et al., "Hierarchical wood cellulose fiber/epoxy biocomposites—Materials design of fiber porosity and nanostructure," *Composites: Part A*, 2015, 74: pp. 60-68.
Atwater et al., "Plasmonics for improved photovoltaic devices," *Nature Materials*, 2010, 9: pp. 205-213.
Bao et al., "Aqueous gating of van der Waals materials on bilayer nanopaper," *ACS Nano*, 2014, 8(10): pp. 10606-10612.
Butchosa et al., "Nanocomposites of bacterial cellulose nanofibers and chitin nanocrystals: fabrication, characterization and bactericidal activity," *Green Chemistry*, 2013, 15: pp. 3404-3413.
Fang et al., "Highly transparent paper with tunable haze for green electronics," *Energy & Environmental Science*, 2014, 7: pp. 3313-3319.

(56) References Cited

OTHER PUBLICATIONS

Fang et al., "Novel Nanostructured Paper with Ultrahigh Transparency and Ultrahigh Haze for Solar Cells," *Nano Letters*, 2014, 14(2): pp. 765-773.
Ha et al., "Paper-Based Anti-Reflection Coatings for Photovoltaics," *Advanced Energy Materials*, 2014, 4(9): 1301804.
Han et al.,"Extremely efficient flexible organic light-emitting diodes with modified graphene anode," *Nature Photonics*, 2012, 6: pp. 105-110.
Hu et al., "Scalable coating and properties of transparent, flexible, silver nanowire electrodes," *ACS Nano*, 2010, 4(5): pp. 2955-2963.
Hu et al., "Transparent and conductive paper from nanocellulose fibers," *Energy & Environmental Science*, 2013, 6: pp. 513-518.
Isogai et al., "TEMPO-oxidized cellulose nanofibers," *Nanoscale*, 2011, 3: pp. 71-85.
Jin et al., "High-performance hybrid plastic films: a robust electrode platform for thin-film optoelectronics," *Energy & Environmental Science*, 2013, 6: pp. 1811-1817.
Jung et al.,"High-performance green flexible electronics based on biodegradable cellulose nanofibril paper," *Nature Communications*, May 2015, 6:7170.
Koga et al., "Uniformly connected conductive networks on cellulose nanofiber paper for transparent paper electronics," *NPG Asia Materials*, 2014, 6: e93.
Li et al., "Efficient and bright organic light-emitting diodes on single-layer graphene electrodes," *Nature Communications*, Aug. 2013, 4: 2294.
Liu et al., "Extremely stable-color flexible white organic lightemitting diodes with efficiency exceeding 100 lm $W^{-1}$," *Journal of Materials Chemistry C*, 2014, 2: pp. 9836-9841.
Liu et al., "Highly flexible, transparent cellulose composite films used in UV imprint lithography," *Cellulose*, 2013, 20: pp. 907-18.
Nogi et al., "Fiber-content dependency of the optical transparency and thermal expansion of bacterial nanofiber reinforced composites," *Applied Physics Letters*, 2006, 88: 133124.
Nogi et al., "Foldable nanopaper antennas for origami electronics," *Nanoscale*, 2013, 5: pp. 4395-4399.
Nogi et al., "Optically Transparent Nanofiber Paper," *Advanced Materials*, 2009, 21: pp. 1595-1598.
Nogi et al., "Transparent Nanocomposites Based on Cellulose Produced by Bacteria Offer Potential Innovation in the Electronics Device Industry," *Advanced Materials*, 2008, 20: pp. 1849-1852.
Reineke et al., "White organic light-emitting diodes with fluorescent tube efficiency," *Nature*, May 2009, 459: pp. 234-238.
Sehaqui et al., "Fast Preparation Procedure for Large, Flat Cellulose and Cellulose/Inorganic Nanopaper Structures," *Biomacromolecules*, 2010, 11: pp. 2195-2198.
Spinelli et al., "Broadband omnidirectional antireflection coating based on subwavelength surface Mie resonators," *Nature Communications*, 2012, 3: 692.
Tang et al., "A Transparent, Hazy, and Strong Macroscopic Ribbon of Oriented Cellulose Nanofibrils Bearing Poly(ethylene glycol)," *Advanced Materials*, 2015, 27: pp. 2070-2076.
Wang et al., "Light trapping in photonic crystals," *Energy & Environmental Science*, 2014, 7: pp. 2725-2738.
Yano et al., "Optically transparent composites reinforced with networks of bacterial nanofibers," *Advanced Materials*, 2005, 17(2): pp. 153-155.
Zheng et al., "Nanostructured paper for flexible energy and electronic devices," *MRS Bulletin*, Apr. 2013, 38: pp. 320-325.
Zhong et al.,"Self-Powered Human-Interactive Transparent Nanopaper Systems," *ACS Nano*, 2015, 9(7): pp. 7399-7406.
Zhu et al., "Biodegradable transparent substrates for flexible organic-light-emitting diodes," *Energy & Environmental Science*, 2013, 6: pp. 2105-2111.
Zhu et al., "Extreme Light Management in Mesoporous Wood Cellulose Paper for Optoelectronics," *ACS Nano*, 2016, 10: pp. 1369-1377.

\* cited by examiner

FIG. 17C

TRANSPARENT HYBRID SUBSTRATES, DEVICES EMPLOYING SUCH SUBSTRATES, AND METHODS FOR FABRICATION AND USE THEREOF

CROSS-REFERENCE TO RELATED APPLICATIONS

The present application claims the benefit of U.S. Application No. 62/510,033, filed May 23, 2017, which is hereby incorporated by reference herein in its entirety.

STATEMENT REGARDING FEDERALLY SPONSORED RESEARCH

This invention was made with government support under CMMI1362256 awarded by the National Science Foundation (NSF). The government has certain rights in the invention.

FIELD

The present disclosure generally relates to transparent substrates, and, more particularly, to transparent hybrid substrates with improved optical properties such as optical haze and optical transmittance.

SUMMARY

In embodiments, a porous base substrate is infiltrated with a polymer material to form a hybrid substrate. Prior to infiltration, the base substrate may exhibit relatively low optical transmittance (e.g., less than 50% for wavelengths of 400-1100 nm). For example, the base substrate may composed of paper, textile (whether woven or nonwoven), aerogel, natural wood, or any other porous material. In some embodiments, by infiltrating the base substrate with a polymer (i.e., by filling the pores of the base substrate with the polymer) having a similar refractive index to that of the material of the base substrate, the transmittance can be improved thereby resulting in a transparent hybrid substrate that exhibits both relatively high optical haze (e.g., greater than 50%) and relatively high optical transmittance (e.g., greater than 80%) within the visible light spectrum. In other embodiments, the infiltrating polymer may have a dissimilar refractive index with respect to the base substrate, for example, to increase the optical haze of the hybrid substrate. Thus, appropriate selection of materials of the hybrid substrate can tailor the optical properties thereof.

The hybrid substrate can serve as a base for fabricating electronic devices or can be coupled to electronic or other devices, especially optical devices that can take utilize the unique optical properties of the hybrid substrate. Such devices include, but are not limited to, electronic circuits (e.g., semiconductor-based transistors), opto-electronic devices (e.g., optical waveguides, light-emitting diodes (LEDs), laser diodes, etc.), energy converting devices (e.g., solar cells), and energy storage devices (e.g., batteries).

In one or more embodiments, a device comprises a hybrid substrate with a base substrate and a first polymer material. The base substrate has a plurality of pores therein, with the pores having a size between 10 nm and 500 µm, inclusive (for example, between 10 nm and 100 µm). The first polymer material can fill the pores of the base substrate.

In one or more embodiments, a method comprises filling pores of a base substrate with a first polymer material to form a hybrid substrate, where the pores of the base substrate have a size between 10 nm and 500 µm, inclusive (for example, between 10 nm and 100 µm)

In one or more embodiments, the base substrate can be at least one of paper composed of cellulose fibers, a woven textile composed of natural or artificial fibers, a non-woven textile composed of natural or artificial fibers, an aerogel, a matrix composed of natural or artificial fibers, a material with aligned pores, natural wood material, and any other porous substrate.

In one or more embodiments, the base substrate can be a substrate with randomly arranged pores, such as a textile, paper, aerogel, and natural wood material, or a substrate with an ordered arrangement of pores, such as a precisely woven textile, freeze-dried substrate, and a 3-D printed substrate.

In one or more embodiments with relatively high optical transmittance for the hybrid substrate, the first polymer material can have a refractive index within 10%, and preferably within 2%, of a refractive index of a material of the base substrate.

In one or more embodiments with relatively high optical haze for the hybrid substrate, the first polymer material can have a refractive index greater than 10% of a refractive index of a material of the base substrate.

Objects and advantages of embodiments of the disclosed subject matter will become apparent from the following description when considered in conjunction with the accompanying drawings.

BRIEF DESCRIPTION OF THE DRAWINGS

Embodiments will hereinafter be described with reference to the accompanying drawings, which have not necessarily been drawn to scale. Where applicable, some features may not be illustrated to assist in the illustration and description of underlying features.

Throughout the figures, like reference numerals denote like elements.

DETAILED DESCRIPTION

Figure 1:
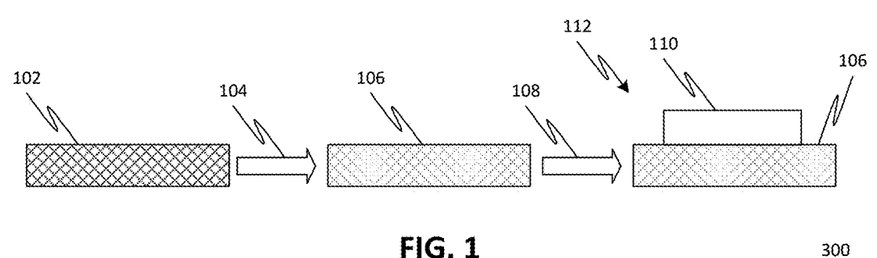
FIG. 1 is a simplified diagram illustrating features of fabrication and use of a hybrid substrate, according to one or more embodiments of the disclosed subject matter.

Embodiments of the disclosed subject matter provide novel hybrid substrates formed by infiltrating a transparent polymer into a porous base substrate. For example, FIG. 1 shows a porous base substrate 102, which undergoes a polymer infiltration process at 104 to yield a transparent hybrid substrate 106. The resulting hybrid substrate 106 can then be used at 108 as part of a system 112, for example, as a base for forming layer 110 (e.g., electronic device), or as a covering, light guide, or other optical component for layer 110 (e.g., electronic device). In some embodiments, 110 can be an additional passive substrate, such as another polymer layer (e.g., the same or different material from the infiltrating polymer) or glass plate, instead of or in addition to an electronic device.

The porous base substrate 102 can be any type of porous material. For example, the base substrate 102 can be formed of a material with randomly arranged (and/or sized) pores within a fibrous matrix, such as, but not limited to paper composed of cellulose fibers, a woven textile composed of natural or artificial fibers, a non-woven textile composed of natural or artificial fibers, an aerogel, a matrix composed of natural or artificial fibers, and a natural wood material. For example, the porous base substrate 102 can have pores with a size between 10 nm and 100 µm, and a fiber diameter between 1 µm and 100 µm.

Alternatively or additionally, the base substrate 102 can be formed of a material having an ordered arrangement (and/or size) of pores, such as, but not limited to precisely woven textile composed of natural or artificial fibers, a freeze-dried substrate, a 3-D printed substrate, and a micromachined substrate. In some embodiments, the ordered arrangement of pores may be considered to be aligned, i.e., where a series of pores line up to define a substantially contiguous linear path through the base substrate. In such configurations, the ordered arrangement of pores may provide enhanced guiding of light through the hybrid substrate. In such configurations, the aligned pores may have diameters of 10 nm to 500 µm, and may be spaced from adjacent pores by a distance of 1 µm to 500 µm.

Figure 17A:
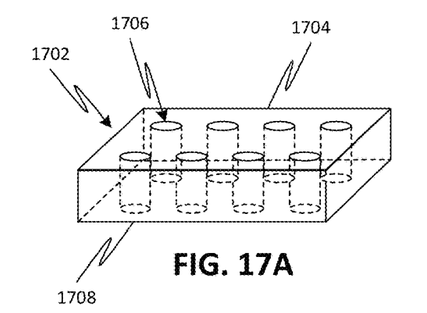
FIGS. 17A-17C are simplified diagrams of hybrid substrate, where the base substrate has aligned pores and has been infiltrated by a polymer, according to one or more embodiments of the disclosed subject matter.
Figure 17B:
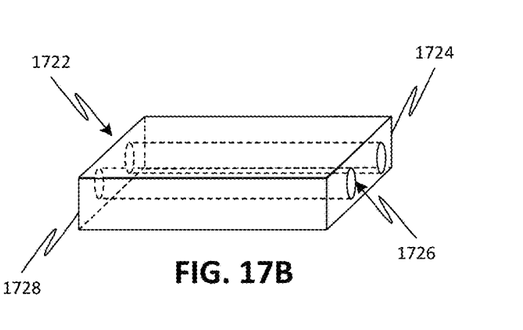
Figure 17C:
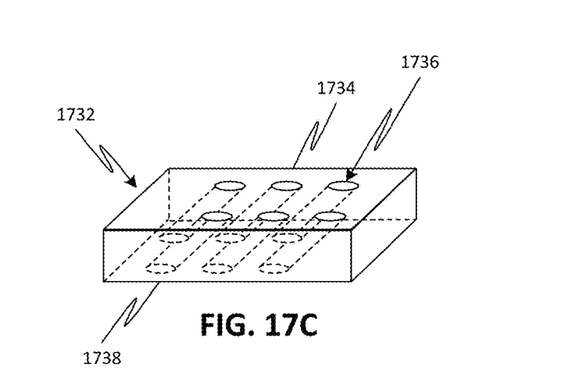

For example, FIG. 17A illustrates a base substrate 1702 that has aligned pores 1706 extending between horizontal surfaces 1704 and 1708, which pores 1706 are infiltrated with polymer to form a hybrid substrate. Similarly, FIG. 17B illustrates another exemplary base substrate 1722 where aligned pores 1726 extend between vertical surfaces 1724 and 1728, which pores 1726 are infiltrated with polymer to form a hybrid substrate. It is also possible for the aligned pores to be at angle with respect to surfaces of the base substrate or hybrid substrate. For example, FIG. 17C illustrates a base substrate 1732 that has angled aligned pores 1736 extending between horizontal surfaces 1736 and 1738. It is also possible for the features of FIGS. 17A-17C to be combined in a single device, where pores 1706, 1726, and 1736 may or may not intersect.

The infiltrating polymer can be any type of thermosetting or thermoplastic polymer capable of being infiltrated into the pores of the base substrate 102. For example, the polymer can be epoxy resin, polymethyl methacrylate (PMMA), polyvinyl alcohol (PVA), polydimethylsiloxane (PDMS), polyethylene terephthalate (PET), polycarbonate (PC), or any other transparent plastic.

Selection of the materials of the transparent polymer and the porous base substrate 102, as well as the techniques used to fabricate the hybrid substrate 106, can tailor the resulting optical characteristics of the hybrid substrate. For example, in some embodiments, the material for the transparent polymer is selected to have a refractive index similar (i.e., within at least 10%, and preferably within 2%) to the refractive index of the base substrate 102. The resulting hybrid substrate can thus exhibit relatively high optical transparency (e.g., 80-95% within a wavelength range of 400 nm to 1100 nm, inclusive) and a relatively high optical haze (e.g., 50-95% within a wavelength range of 400 nm to 1100 nm, inclusive).

Without the infiltrating polymer, the base substrate 102 may otherwise have a relatively low optical transmittance but a relatively high optical haze. Prior to infiltrating the polymer may otherwise have a relatively high optical transmittance but a relatively low optical haze. However, in embodiments of the disclosed subject matter, the hybrid substrate 106 can effectively combine the optical transmittance and haze features of the transparent polymer and the base substrate 102 to great advantage. Indeed, a transparent substrate 106 with inherent high transmission haze can more effectively couple light into or out of device 110 through the substrate 106 and shows a broadband and angle insensitive response.

For example, the optical haze and transmittance properties lead to extraordinary performance when used in organic light emitting diodes (OLEDs) and thin film solar cells, among other applications. Moreover, by appropriate control of the fabrication process (e.g., by template-assisted infiltration), the hybrid substrate 106 can be fabricated with extremely flat surfaces (e.g., on the order of 10 nm surface roughness (arithmetic average roughness)) that further enhances optical coupling of light incident on surfaces of the hybrid substrate or that can serve as a base layer for fabrication of optical or electronic devices thereon.

In other embodiments, the material for the transparent polymer is selected to have a refractive index different (i.e., greater than 20%) from the refractive index of the base substrate 102. The resulting hybrid substrate 106 can thus exhibit improved optical haze with only slight degradation in optical transmittance/transparency.

The combination of polymer and base substrate can also offer enhanced physical characteristics as compared to the constituent materials. Thus, while the base substrate 102 may otherwise be susceptible to environmental factors, the combination with the polymer may imbue the resulting hybrid substrate 106 with environmental resistance. For example, the hybrid substrate 106 may be resistant to water, solvents, and other environmental conditions that may otherwise cause degradation of the underlying base substrate 102.

Additionally or alternatively, the hybrid substrate 106 may enjoy enhanced mechanical properties, such as bendability, stretchability, and mechanical strength. Such mechanical properties may depend on the infiltrating polymer material and/or the material for the base substrate 102. For example, when the polymer is one of PMMA, PVA, or PDMS, the hybrid substrate 106 may be more stretchable than a hybrid structure with epoxy resin as the infiltrating polymer.

Figure 2A:
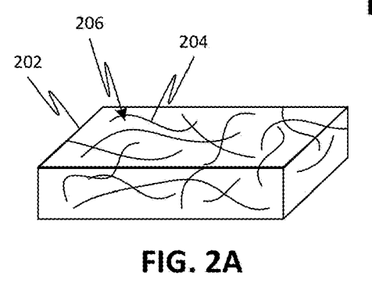
FIG. 2A is a simplified diagram of a porous base substrate before polymer infiltration.

Referring to FIGS. 2A-6B, an embodiment of a transparent hybrid substrate employing paper as the base substrate will be described. Paper has intrinsic high haze due to randomly mixed cellulose microfibers 204 that can largely scatter light. Note that only a sampling of microfibers 204 are illustrated in FIG. 2A for the sake of clarity. Employing paper as base substrate 202 will also scatter light due to its mesoporous structure (nanometer or micron sized pores 206 between fibers 204), which yields both a rough surface (e.g., micrometer size roughness) for light input/output as well as numerous fiber/air interfaces within the substrate 202 that scatter light. As a result, the paper substrate 202 of FIGS. 2A-2C has a low transmittance (e.g., <40%) and a high haze (e.g., >90%), and thus appears opaque.

Figure 3A:
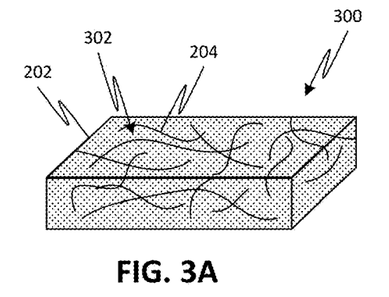
FIG. 3A is a simplified diagram of a hybrid substrate, where the base substrate has been infiltrated by a polymer, according to one or more embodiments of the disclosed subject matter.
Figure 3B:
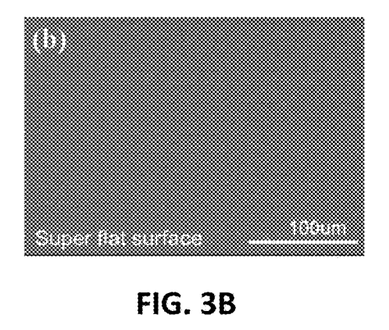
FIG. 3B is an SEM image of a top of a hybrid substrate, in which a mesoporous cellulose-based paper of FIG. 2B as base substrate has been infiltrated by an epoxy resin, according to one or more embodiments of the disclosed subject matter.
Figure 3C:
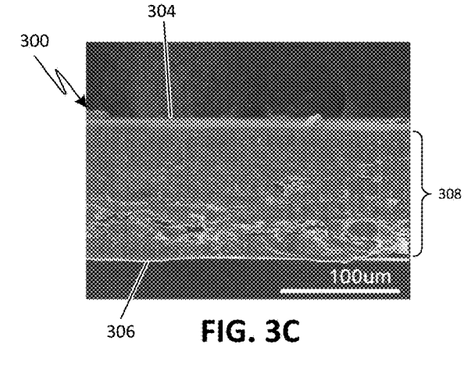
FIG. 3C is an SEM image of a cross-section of the hybrid substrate of FIG. 3B.

By impregnating the paper substrate 202 with an appropriate polymer 302, the pores 206 of the base substrate 202 are filled, thereby converting the opaque paper into a transparent hybrid substrate 300, as shown in FIGS. 3A-3C. In particular, employing a templated polymer infiltration technique (described in further detail below), the micro-sized air pores 206 inside the paper 202 were filled with a polymer having a similar refractive index and super flat surface layers (e.g., surface roughness less than 10 nm) were formed by transferring from templates.

In a fabricated embodiment, commercially available roll paper (Boardwalk B1540900 Butcher Paper) was used as the base substrate 202. The mesoporous, fibrous structure of the paper substrate 202 allows fast polymer infiltration to form the hybrid substrate 300. Transparent thermal setting epoxy resin (AeroMarine 300/21 Epoxy Resin, available from AeroMarine Products, San Diego, Calif.) was used as infiltration polymer since it has a refractive index (e.g., 1.522) similar to that of cellulose (e.g., 1.544), thereby reducing scattering at interfaces. The epoxy resin also has low viscosity and superior mobility before curing so as to easily infiltrate the pores of the paper substrate 202. The epoxy resin also exhibits good mechanical properties and solvent stability after curing that offers further protection to the hybrid substrate.

Infiltration of the epoxy resin was performed using a template to improve the surface roughness of the resulting hybrid substrate. In particular, PDMS was used as a flat template for the templated infiltration to ensure super flat surface transferring. PDMS was chosen for the template since it does not react nor adhere to the epoxy resin and has been well developed for the transfer of surface features. However, embodiments of the disclosed subject matter are not limited thereto, and other templates can be used according to one or more contemplated embodiments. In general, the material for the template should not react nor adhere to the infiltrating polymer material and/or to the material of the base substrate.

PDMS was poured onto a high-quality glass substrate (or other substantially flat substrate, such as a semiconductor wafer) and cured at 150° C. for 20 mins to yield a template with superior surface flatness (e.g., less than 10 nm surface roughness). The commercially available roll paper was coated with epoxy resin (20% wt of the paper) on top and bottom surfaces. The coated paper was then placed between two PDMS templates and held flat during curing (air dry at room temperature for 1 day, under pressure).

Figure 2B:
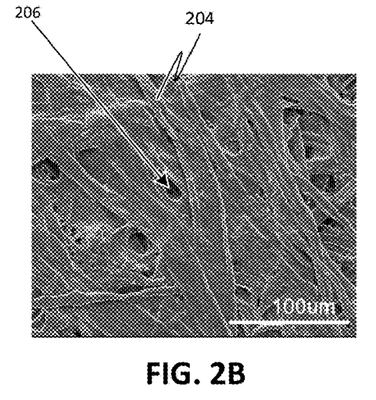
FIG. 2B is a scanning electron microscope (SEM) image of a top of mesoporous cellulose-based paper as a base substrate.
Figure 2C:
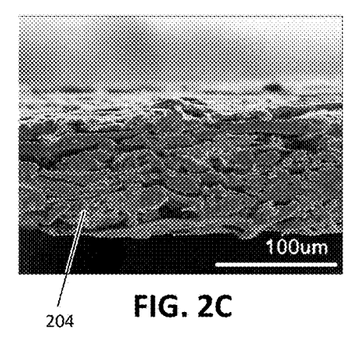
FIG. 2C is an SEM image of a cross-section of the mesoporous cellulose-based paper of FIG. 2B.

As shown in FIGS. 2B-2C, the paper substrate 202 prior to polymer infiltration has micro-sized cellulose fibers 204 squeezed into a flat shape and intertwined together to form the substrate with micrometer surface roughness. After templated infiltration of epoxy resin, the hybrid substrate 300 has a smooth surface without clear features, as shown in FIG. 3B. The porous and rough surface of FIG. 2B has been replaced with a dense and flat surface resin layer. Similarly, the loosely-packed structure of the paper substrate shown in the cross-section of FIG. 2C has been replaced with a densely-packed structure where the epoxy resin fills the pores of the paper substrate, as shown in the cross-section of hybrid substrate 300 in FIG. 3C.

Figure 3D:
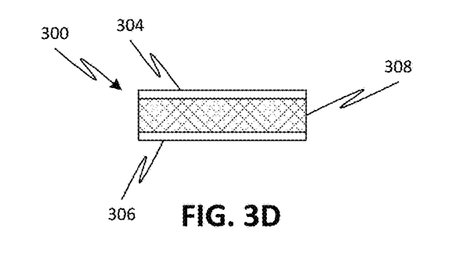
FIG. 3D is a simplified diagram illustrating a cross-sectional view of a hybrid substrate, where thin polymer layers are formed on opposing surfaces of the substrate, according to one or more embodiments of the disclosed subject matter.
Figure 3E:
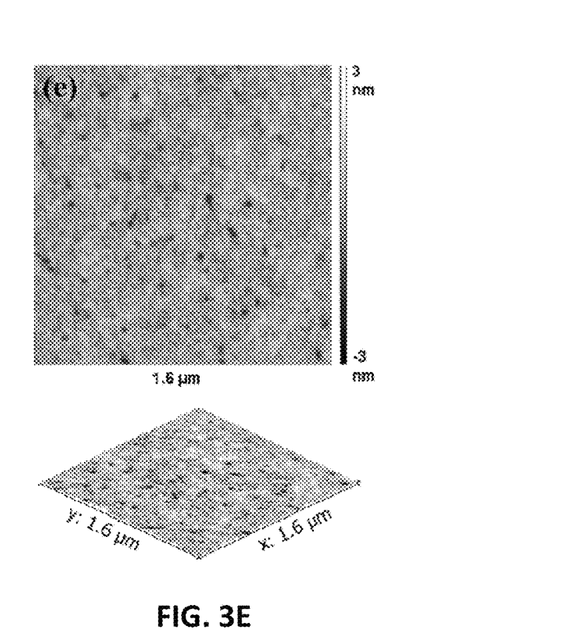
FIG. 3E shows atomic force microscopy (AFM) characterization of the hybrid substrate of FIG. 3B.

In addition, the templated curing formed thin surface layers 304, 306 of epoxy resin on each surface of the infiltrated paper substrate 308, as shown in FIGS. 3C-3D. For example, the surface layers 304, 306 can have a thickness of less than 10 μm. The thin surface layers 304, 306 can ensure a desired flatness for the hybrid substrate 300, as well as further protecting the constituent material of the paper substrate 202 underneath. Atomic force microscopy (AFM) investigation of an area (1.6 μm×1.6 μm) of the fabricated hybrid substrate 300 revealed a local surface roughness of approximately 3 nm, as shown graphically in FIG. 3E.

After templated infiltration, the small surface roughness of the hybrid substrate 300 minimizes, or at least reduces, light scattering at the surface for high transparency with respect to input light 402. Meanwhile, the hybrid substrate 300 still has numerous interfaces between polymer 302 and cellulose microfibers 204, which lead to small angle scattering inside the substrate 300, resulting a high transmission haze for the transmitted light 404, as illustrated schematically in FIG. 4A. For example, the resulting hybrid substrate 300 has a high optical transmittance (e.g., >85%) and high transmittance haze (e.g., >90%).

Figure 4A:
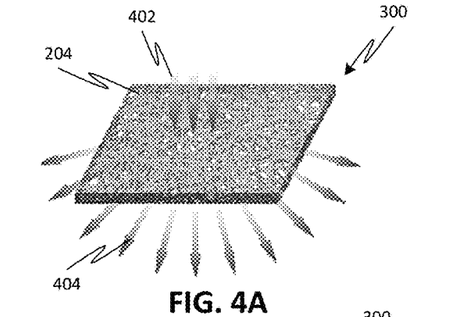
FIG. 4A is a simplified diagram illustrating optical transmittance characteristics of the hybrid substrate of FIG. 3A.
Figure 4B:
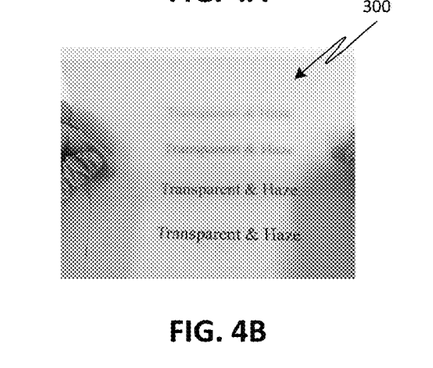
FIG. 4B is an image of transmission through the hybrid substrate of FIG. 3B.

FIG. 4B shows an image of the fabricated embodiment of the hybrid substrate 300, where the clear letters at the lower part (where the hybrid substrate 300 is in contact with the background writing) reflects the high transparency of substrate 300 while the fuzzy letters at the upper part (where the hybrid substrate 300 is held away from the background writing) reflects the high haze of substrate 300.

Figure 5A:
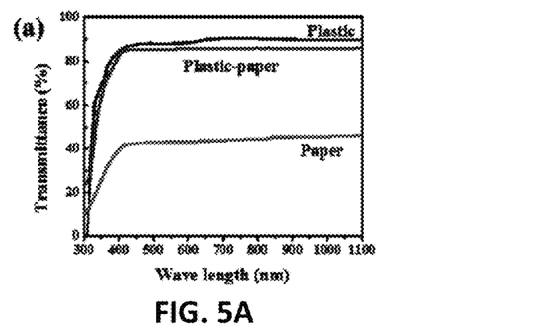
FIG. 5A is a graph of total transmittance for a polyethylene terephthalate (PET) substrate (labeled as plastic), a cellulose-based paper substrate without polymer infiltration (labeled as paper), and the hybrid substrate of FIG. 3B (labeled as plastic-paper).

Optical and mechanical properties of the fabricated embodiment of the hybrid substrate 300 were compared against those of substrates formed of constituent materials (i.e., the roll paper and PET). In particular, the total transmittance of a substrate of PET, a substrate of plain roll paper, and the hybrid substrate 300 were measured using an integrated sphere. As shown in FIG. 5A, the PET substrate (labeled plastic) has the highest optical transmittance of ~90%. The hybrid substrate 300 (labeled plastic-paper) demonstrates comparable performance, with a total transmittance of ~85-90% from 400 nm to 1100 nm (broadband). In contrast, the plain roll paper substrate has the lowest optical transmittance at less than 40%. This increase broadband, high transmittance of the hybrid substrate 300 is a product of its flat input/output surfaces (e.g., surfaces 304, 306) as well as the increased packing density after polymer infiltration into the porous paper (e.g., density increasing from 7 mg/cm$^2$ for the plain paper to 9.5 mg/cm$^2$ for the hybrid substrate).

Figure 5B:
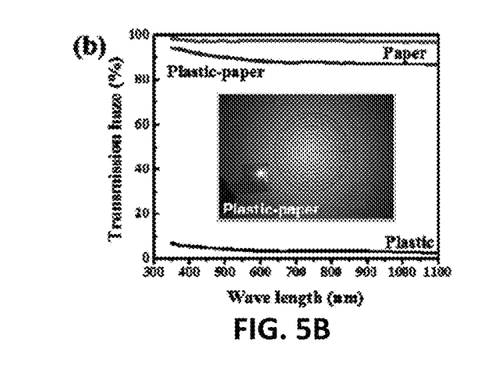
FIG. 5B is a graph of optical haze for a polyethylene terephthalate (PET) substrate (labeled as plastic), a cellulose-based paper substrate without polymer infiltration (labeled as paper), and the hybrid substrate of FIG. 3B (labeled as plastic-paper), with an image in the inset illustrating the light scattering effects of the hybrid substrate.

Optical haze is used to describe the light scattering ability and was measured for the substrate of PET, the substrate of plain roll paper, and the hybrid substrate 300. As shown in FIG. 5B, the PET substrate exhibits an ultra-low transmission haze of less than 5%. In contrast, both the plain paper substrate and the hybrid substrate 300 exhibit relatively high haze (e.g., above ~90% from 400 nm to 1100 nm (broadband)). Thus, most of the light was reflected or scattered when passing through the paper substrate or the hybrid substrate 300. This light scattering effect, or haze effect, is visually displayed in the inset in FIG. 5B. Note that the laser passing through the hybrid substrate 300 exhibits both high intensity and a highly scattered light pattern, which is indicative of the favorable transmittance and haze properties of the hybrid substrate.

Figure 5C:
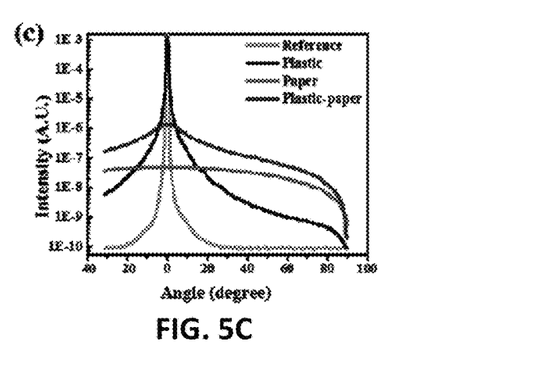
FIG. 5C is a graph of angular distribution of transmitted light for a polyethylene terephthalate (PET) substrate (labeled as plastic), a cellulose-based paper substrate without polymer infiltration (labeled as paper), and the hybrid substrate of FIG. 3B (labeled as plastic-paper).
Figure 5D:
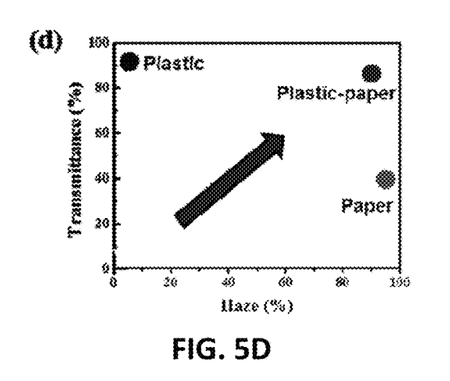
FIG. 5D is a graph of total transmittance versus transmission haze for a polyethylene terephthalate (PET) substrate (labeled as plastic), a cellulose-based paper substrate without polymer infiltration (labeled as paper), and the hybrid substrate of FIG. 3B (labeled as plastic-paper).

The angular dependence of the optical haze was further characterized for the substrate of PET, the substrate of plain roll paper, and the hybrid substrate 300, based on the angular distribution of laser light transmitted therethrough. As shown in FIG. 5C, the PET substrate has a very narrow-angle distribution, with the transmitted light being focused within an angle less than 2° (estimated as 5% of peak intensity). In contrast, the paper substrate and the hybrid substrate 300 had similarly broad angle distributions (i.e., 60°-80°). The transmitted light intensity for the hybrid substrate 300 is also orders of magnitude higher than that of the paper substrate. Indeed, as shown in FIG. 5D, the hybrid substrate 300 combines the advantageous optical transmittance properties of naked polymer substrates with the advantageous optical haze properties of naked paper substrates.

Figure 6A:
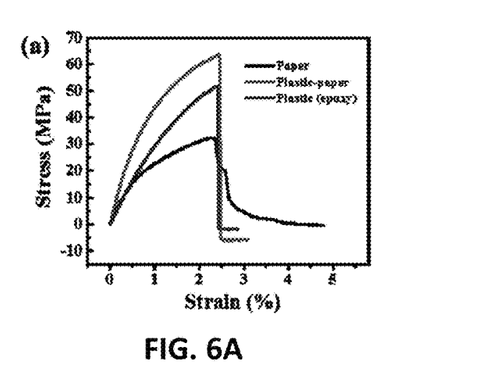
FIG. 6A is a graph of mechanical stress versus strain for a cellulose-based paper substrate without polymer infiltration (labeled as paper), the hybrid substrate of FIG. 3B (labeled as plastic-paper), and a substrate of epoxy resin (labeled as plastic (epoxy)).

In addition to the beneficial optical characteristics noted above, the hybrid substrate 300 also demonstrates improved mechanical and reliability characteristics. For example, FIG. 6A shows stress-strain curves for the plain paper substrate, the hybrid substrate 300, and a substrate formed of the epoxy resin film. As illustrated in FIG. 6A, the ultimate strength and storage modulus of the hybrid substrate is better than that of the other substrates due to a synergistic relationship between the porous base substrate and the infiltrated polymer—i.e., the epoxy resin holds the porous fibers together while the fiber structure reinforces the polymer matrix.

Figure 6B:
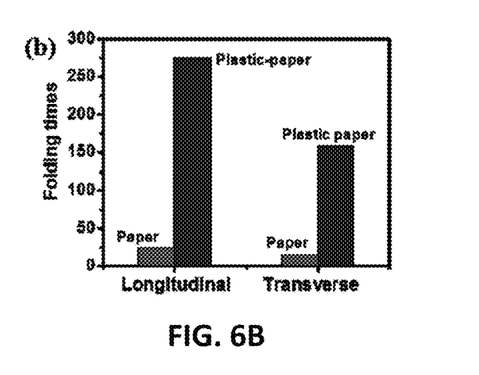
FIG. 6B is a graph of measured folding capacity of a cellulose-based paper substrate without polymer infiltration (labeled as paper) and the hybrid substrate of FIG. 3B (labeled as plastic-paper), for longitudinal direction (length direction in which the substrate is rolled/unrolled) and transverse direction (width direction perpendicular to the direction in which the substrate is rolled/unrolled).

FIG. 6B shows folding endurance numbers for the plain paper substrate and the hybrid substrate 300. Each sample substrate was pulled with a constant force (e.g., 14.7N) and folded to 135° repeatedly until broken. As shown in FIG. 6B, the hybrid substrate 300 is capable of at least 10 times more folding than the plain paper substrate. The above noted mechanical properties, especially tear folding capacity, enable the usage of the hybrid substrates as a reliable transparent substrate in applications where it may be subject to frequent or constant bending or flexing, for example, wearable device applications.

Moreover, the hybrid substrate 300 enjoys improved environmental stability, especially with respect to water or solvents, which may be an important consideration for composite device fabrication. While plain paper substrates are generally unstable in solvents (e.g., water) and readily change shape in response to wet-dry cycles, the hybrid substrate 300 is highly stable after exposure to a variety of solvents, including those employed in semiconductor manufacturing.

For example, after a three-week-long stability test in water, regular roll paper had completely disintegrated into cellulose microfibers while the hybrid substrate 300 maintained its shape without any noticeable changes. For the hybrid substrate, the epoxy resin is itself highly water resistant. Moreover, the epoxy resin crosslinks the cellulose microfibers of the base substrate together, thereby preventing, or at least reducing, disintegration. When soaked in solvents (including water), regular paper tends to swell and then dries with many wrinkles. In contrast, the hybrid substrate retains its shape after exposure to solvents. As such, the hybrid substrate can used as a flexible substrate for devices that use lithography and patterning processes containing different solvents.

In addition, a low water and vapor permeation rate (WVPR) is desirable for devices containing sensitive components such as conductive and semi-conductive polymers. By forming the hybrid substrate as described above, the air permeation rate can be reduced from 2380 ml/min for the base substrate prior to polymer infiltration to under a limit of detection for the hybrid substrate after polymer infiltration. Though the dense epoxy surface layer 304, 306 is relatively thin (e.g., ~10 µm), the hybrid substrate exhibits an average WVPR of 5.8 g/m$^2$/day, similar to other plastics. The above noted synergistic improvements in surface structure, mechanical properties, solvent stabilities and air permeation rate make the hybrid substrate a viable candidate for device fabrications.

Although the above description focuses on using paper as the base substrate for the hybrid substrate, embodiments of the disclosed subject matter are not limited thereto. Indeed, as also noted above, other porous materials may also be used as the base substrate for the hybrid substrate. Referring to FIGS. 7A-10E, embodiments of transparent hybrid substrates employing textiles as base substrates will be described.

Figure 7A:
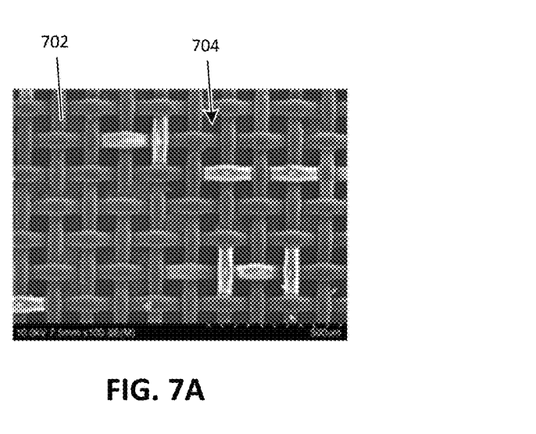
FIG. 7A is an SEM image of a top of a woven textile, with regular periodic weaving of fibers, as a base substrate.
Figure 7B:
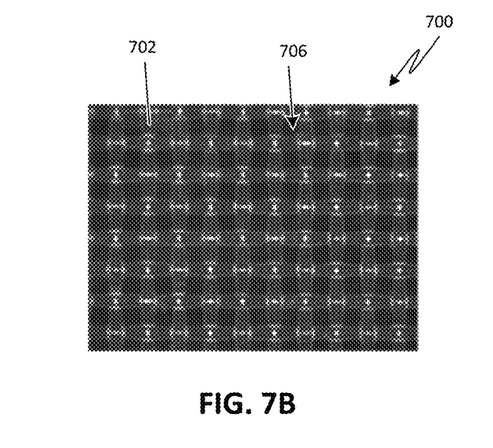
FIG. 7B is a transmission view image of a hybrid substrate, in which the woven textile of FIG. 7A as base substrate has been infiltrated by an epoxy resin, according to one or more embodiments of the disclosed subject matter.
Figure 7C:
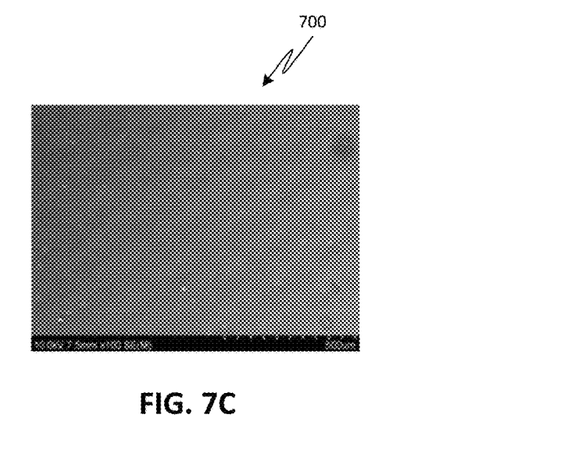
FIG. 7C is an SEM image of a top flat surface of the hybrid substrate of FIG. 7B.

For example, FIG. 7A shows a textile (e.g., polyester) as a base substrate, where fibers 702 are woven together with spaces or pores 704 therebetween. Similar to the paper-based hybrid substrate 300, the textile can be infiltrated with an appropriate polymer to form a hybrid substrate 700 with improved optical and mechanical properties. In particular, employing the disclosed infiltration techniques, the pores 704 between fibers 702 of the textile are filled with polymer 706, as shown in FIG. 7B. After infiltration of the polymer, the hybrid substrate 700 has a smooth surface without clear features, as shown in FIG. 7C.

Figure 7D:
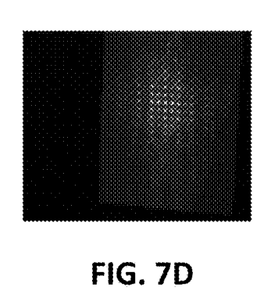
FIG. 7D is an image illustrating the light scattering effects of the hybrid substrate of FIG. 7B.

As with the previously described embodiments, the polymer 706 can be selected to have a refractive index similar to that of the textile fibers 702, thereby improving the transparency of the textile substrate. For example, the polymer 706 can have a refractive index between 1.30 and 1.701 (e.g., epoxy, PDMS, PVP), while the refractive index of the textile (e.g., cotton, nylon, polyester, or other textile material) is between 1.47 and 1.59. The polymer-filled mesopores of the weaved textile of the hybrid substrate 700 generate a periodic scattering pattern for the transmitted light, as illustrated in FIG. 7D. This scattering pattern results from the weaving pattern of the textile, which can be modified to achieve different patterns for the transmitted light.

Figure 8A:
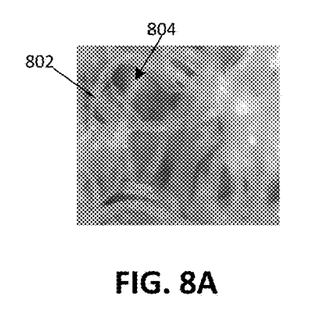
FIG. 8A is an SEM image of a top of a non-woven textile, with randomly oriented and entangled fibers, as a base substrate.
Figure 8B:
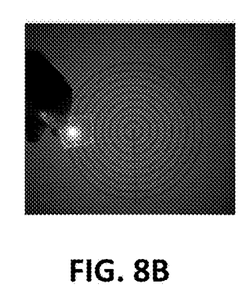
FIG. 8B is an image illustrated the light scattering effects of a hybrid substrate, in which the non-woven textile of FIG. 8A as base substrate has been infiltrated by an epoxy resin, according to one or more embodiments of the disclosed subject matter.

FIG. 8A illustrates a textile (e.g., 55% cellulose and 45% polyester) as a base substrate, where fibers 802 are non-woven (i.e., randomly oriented and entangled fibers of approximately 30 µm in diameter) such that spaces or pores 804 are formed between the fibers 802. Similar to the paper-based hybrid substrate 300 and the woven-textile-based hybrid substrate 700, the non-woven textile can be infiltrated with an appropriate polymer to form a hybrid substrate with improved optical and mechanical properties. The arrangement of fibers 802 within the non-woven textile contribute to a larger isotropic scattering of incoming light, which can be used to increase photo travel path and thereby improve the light coupling in optoelectronic devices. The large haze effect of a hybrid substrate employing non-woven textiles as the base substrate is illustrated in FIG. 8B.

In these textile-based embodiments or any other disclosed embodiment, it is also possible to choose a polymer having a different refractive index from that of the base substrate material. As described in more detail below, such a selection may further improve optical haze of the resulting hybrid substrate, with a decrease (e.g., slight decrease) in optical transmittance. Accordingly, the optical properties of the hybrid substrate may be customized by appropriate selection of constituent materials, as well as surface roughness and/or base substrate structures (e.g., pore size, pore periodicity, fiber alignment, etc.).

Figure 9A:
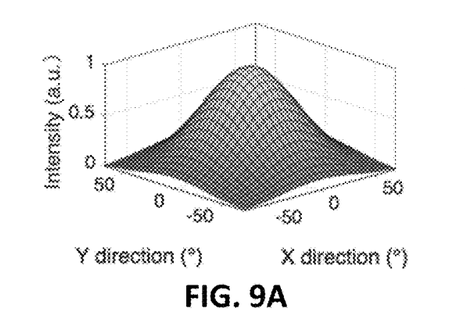
FIG. 9A is a graph illustrating transmitted haze for a hybrid substrate, in which a non-woven textile as base substrate has been infiltrated by polydimethylsiloxane (PDMS), according to one or more embodiments of the disclosed subject matter.
Figure 9B:
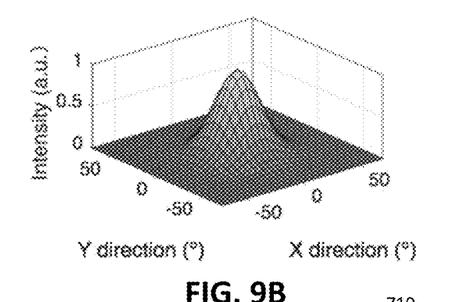
FIG. 9B is a graph illustrating transmitted haze for a hybrid substrate, in which a non-woven textile as base substrate has been infiltrated by an epoxy resin, according to one or more embodiments of the disclosed subject matter.

For example, FIG. 9A shows transmission characteristics of a hybrid substrate with a non-woven textile as the base substrate and infiltrated with PDMS, which has an index of refraction different from that of the textile. Due to the random alignment of the non-woven fibers, the scattering is isotropic. In contrast, FIG. 9B shows transmission characteristics of a hybrid substrate with a non-woven textile as the base substrate and infiltrated with epoxy resin, which has an index of refraction similar to that of the textile. As illustrated in FIG. 9B, the optical haze is smaller than that of FIG. 9A, while the optical transmittance is relatively higher.

Figure 9C:
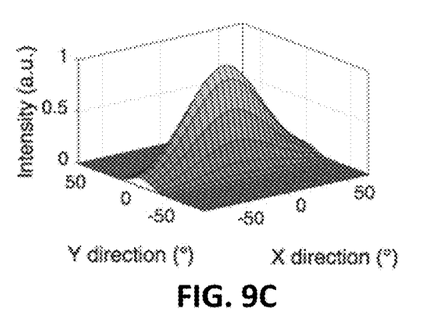
FIG. 9C is a graph illustrating transmitted haze for a hybrid substrate, in which a woven textile, with textile fibers aligned along the x-direction, as base substrate has been infiltrated by epoxy resin, according to one or more embodiments of the disclosed subject matter.
Figure 9D:
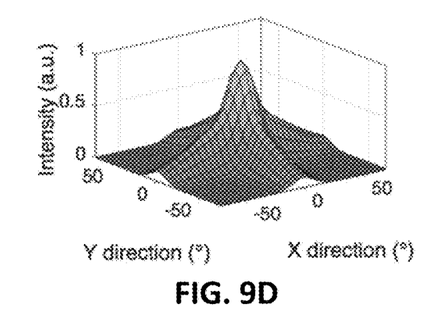
FIG. 9D is a graph illustrating transmitted haze for a hybrid substrate, in which a woven textile, with textile fibers aligned in both the x-direction and the y-direction, as base substrate has been infiltrated by an epoxy resin, according to one or more embodiments of the disclosed subject matter.

FIG. 9C shows transmission characteristics of a hybrid substrate with a woven textile as the base substrate and infiltrated with epoxy resin. In particular, the textile is woven to have a unidirectional fiber alignment, i.e., along the x-direction. As a result, the scattering of the light transmitted through the hybrid substrate is anisotropic, as illustrated by the pattern of FIG. 9C. In contrast, FIG. 9C shows transmission characteristics of a hybrid substrate where the textile is woven to have bidirectional fiber alignment, i.e., fibers aligned in both x- and y-directions. The resulting scattering illustrated in FIG. 9D is a superposition of anisotropic scattering in two directions.

By selecting the base substrate composition and structure, as well as the material for the infiltrating polymer, the optical characteristics of the hybrid substrate can thus be tailored to a particular application. For example, by increasing a mismatch between the refractive indices of the materials of the base substrate and the infiltrating polymer, optical haze can be increased at the expense of optical transparency, as illustrated schematically in FIG. 10B and in FIGS. 10C-10D. Thus, for some applications it may be desirable to select for optical haze by mismatching the refractive indices (e.g., by using PDMS as the infiltrating polymer) as in hybrid substrate 712 of FIG. 10A. In other applications it may desirable to select for improved optical transparency by closely matching the refractive indices (e.g., by using epoxy resin as the infiltrating polymer) as in hybrid substrate 700 of FIG. 10A.

Figure 10A:
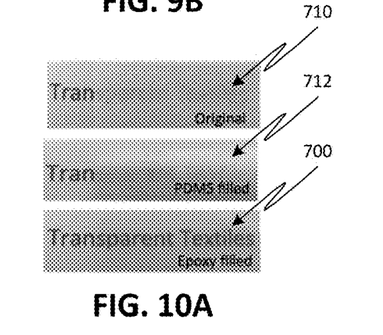
FIG. 10A is an image illustrating the different transmission characteristics for a textile without polymer infiltration (labeled as original), a hybrid substrate formed by the textile infiltrated by PDMS (labeled as PDMS filled), and a hybrid substrate formed by the textile infiltrated by epoxy resin (labeled as Epoxy filled).
Figure 10B:
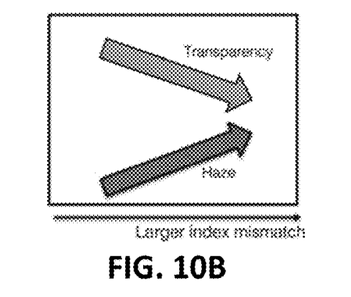
FIG. 10B is a diagrammatic graph of the relationship of transparency and haze of the hybrid substrate to the degree of mismatch between refractive indices of materials of the base substrate and the infiltration polymer.
Figure 10C:
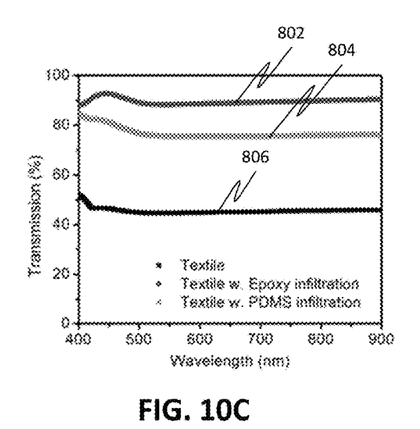
FIG. 10C is a graph of transmission versus wavelength for a textile without polymer infiltration (labeled as textile 806), a hybrid substrate formed by the textile infiltrated by PDMS (labeled as PDMS infiltration 804), and a hybrid substrate formed by the textile infiltrated by epoxy resin (labeled as Epoxy infiltration 802).
Figure 10D:
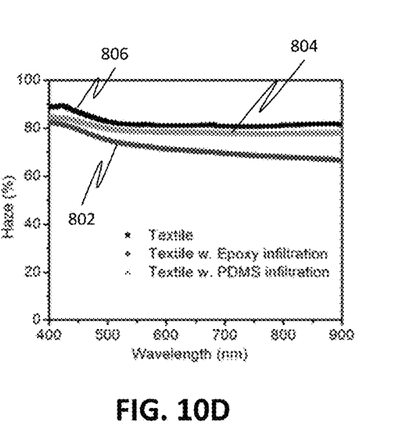
FIG. 10D is a graph of optical haze versus wavelength for a textile without polymer infiltration (labeled as textile 806), a hybrid substrate formed by the textile infiltrated by PDMS (labeled as PDMS infiltration 804), and a hybrid substrate formed by the textile infiltrated by epoxy resin (labeled as Epoxy infiltration 802).
Figure 10E:
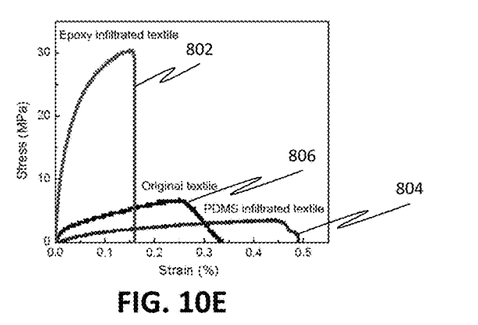
FIG. 10E is a graph of mechanical stress versus strain for a textile without polymer infiltration (labeled as textile 806), a hybrid substrate formed by the textile infiltrated by PDMS (labeled as PDMS infiltration 804), and a hybrid substrate formed by the textile infiltrated by epoxy resin (labeled as Epoxy infiltration 802).

The mechanical characteristics of the hybrid substrate can also be tailored based on selection of the infiltrating polymer and the base substrate composition and structure. For example, the ductility and/or the flexibility of the hybrid substrate depends on the textile structure and the infiltrating polymer, as illustrated in FIG. 10E. Thus, the composition of the hybrid substrate may be adapted to tune the resulting mechanical properties of the hybrid substrate to a particular use.

Although the above description focuses on using paper or textiles as the base substrate for the hybrid substrate, embodiments of the disclosed subject matter are not limited thereto. Indeed, as also noted above, other porous materials may also be used as the base substrate for the hybrid substrate, such as but not limited to aerogels, engineered matrices of fibers, natural wood materials, freeze-dried materials, and 3-D printed materials. In some embodiments, the base substrate may be precisely engineered to have aligned pores, for example, where the pores collaborate to form a series of substantially straight through-holes between surfaces of the base substrate, which alignment may offer certain light guiding advantages once the pores are filled with polymer. For example, the base substrate may have aligned pores and be formed of natural wood, delignified wood, densified wood (i.e., pressed wood), artificial wood, a woven textile, or other porous material.

Figure 11A:
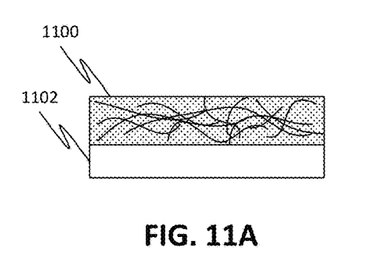
FIG. 11A is a simplified diagram of an assembly including a hybrid substrate and an additional material layer, according to one or more embodiments of the disclosed subject matter.

In any of the above noted embodiments, the hybrid substrate may be combined with other materials and devices to form composite structures. For example, a hybrid substrate 1100 can be combined with a layer of second material 1102 to form a bilayer structure, as illustrated in FIG. 11A. In some embodiments, the second material 1102 can be a polymer, which may the same as or different from the infiltrating polymer of the hybrid substrate 1100. Alternatively, the second material 1102 can be a non-polymer material, such as, but not limited to glass, semiconductor, and metal.

Figure 11B:
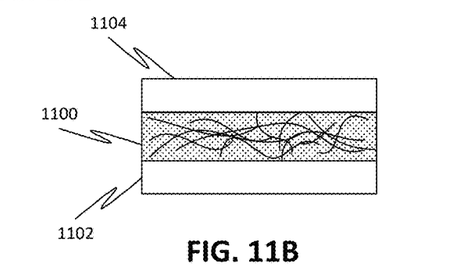
FIG. 11B is a simplified diagram of an assembly including a hybrid substrate and additional material layers, according to one or more embodiments of the disclosed subject matter.

In another example, the hybrid substrate can be combined with layers 1102, 1104 on respective opposing surfaces to form a trilayer structure, as illustrated in FIG. 11B. In some embodiments, layer 1102 and/or layer 1104 can be formed of a polymer, which may the same as or different from the infiltrating polymer of the hybrid substrate 1100. Alternatively, layer 1102 and/or layer 1104 can be formed of a non-polymer material, such as, but not limited to glass, semiconductor, and metal.

Figure 12A:
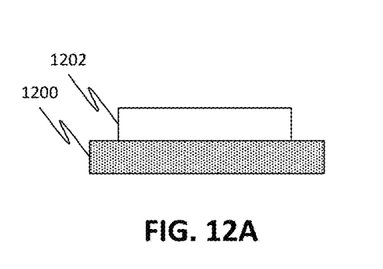
FIG. 12A is a simplified diagram of an assembly including a hybrid substrate and an electronic device, according to one or more embodiments of the disclosed subject matter.

In any of the above noted embodiments, a hybrid substrate 1200 can serve as a support for a previously formed electronic device 1202 (e.g., by laminating the electronic device thereon) or as a base for forming an electronic device 1202 thereon, as illustrated in FIG. 12A. For example, the electronic device 1202 can include at least one of an electronic circuit, a light source, an energy converting device, and an energy storage device.

Figure 12B:
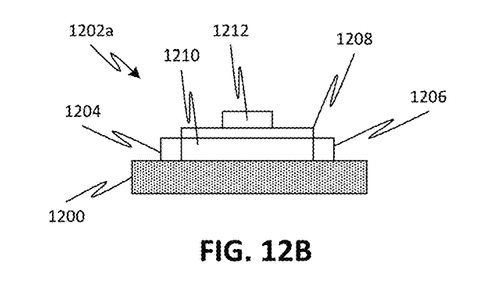
FIG. 12B is a simplified diagram of an assembly including a hybrid substrate and transistor as electronic device, according to one or more embodiments of the disclosed subject matter.

FIG. 12B shows an exemplary composite structure where an electronic device 1202a including a transistor is on a surface of the hybrid substrate 1200. The transistor can include a semiconductor layer 1210 with source 1204 and drain 1206 regions spaced apart from each other to define a channel region between insulating layer 1208 (e.g., dielectric) and the hybrid substrate 1200. A gate electrode 1212 on the insulating layer 1208 can control current flow between the source 1204 and drain 1206 regions via the channel region.

Figure 13A:
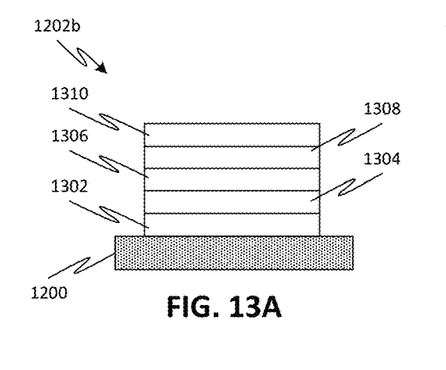
FIG. 13A is a simplified diagram of an assembly including a hybrid substrate and multi-layer light emitting diode (LED) as electronic device, according to one or more embodiments of the disclosed subject matter.

FIG. 13A shows another exemplary composite structure where an electronic device 1202b including an LED is on a surface of the hybrid substrate 1200. The LED can include a bottom electrode layer 1302 (e.g., transparent metal, such as indium tin oxide (ITO)), a hole transport layer 1304 overlying the electrode layer 1302, a light emitting layer 1306 overlying the hole transport layer 1304, an electron transport layer 1308 overlying the light emitting layer 1306, and a top electrode layer 1310 (e.g., opaque or transparent metal) overlying the electron transport layer 1308.

Figure 13B:
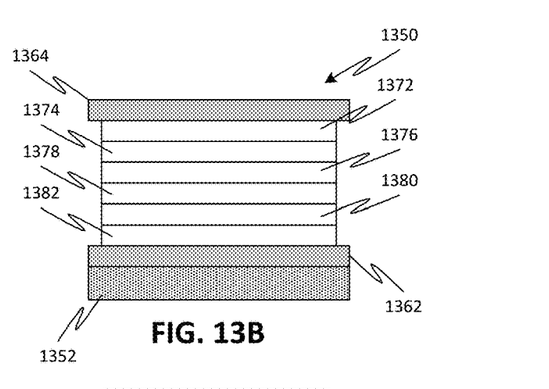
FIG. 13B is a simplified diagram of an assembly including a hybrid substrate and an organic LED (OLED) as electronic device, according to one or more embodiments of the disclosed subject matter.
Figure 13C:
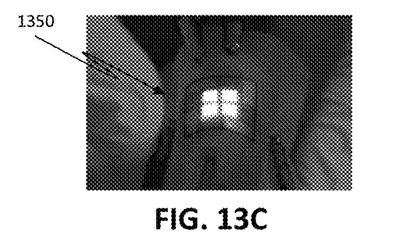
FIG. 13C is an image of a fabricated OLED having the structure of FIG. 13B generating light while being subjected to a bending force.

FIGS. 13B-13C show an example of a fabricated composite structure including an organic LED (OLED) 1350 on the surface of a hybrid substrate 1352 formed by a paper base substrate infiltrated with epoxy resin. The OLED was a 3 mm×3 mm green OLED 1350 that was fabricated directly on the hybrid substrate 1352. In general, OLED technology requires a high degree of flatness for the substrate due to multiple layer fabrication steps as well as a demanding requirement for device encapsulation.

For the composite structure of FIGS. 13B-13C, standard photolithography was used to pattern the layers overlying the hybrid substrate 1352. In particular, a 200 mm×200 mm hybrid substrate 1352 with a thickness of 120 μm was attached to a glass carrier (with similar planar dimensions and 0.7 mm thick) as a mechanical support during the device fabrication process. Repeated deposition (e.g., sputtering, chemical vapor deposition, etc.) and patterning (e.g., photolithography and etching) can be used to build up the multiple layers of the OLED illustrated in FIG. 13B.

As shown in FIG. 13B, the first layer of the OLED 1350 overlying the hybrid substrate 1352 is an indium tin oxide (ITO) layer 1362 acting as an anode and having a thickness of 150 nm. Overlying layer 1362 is layer 1382 formed of tetrauoro-tetracyanoqino dimethane and doped into N,N,N0,N0-tetrakis(4-methoxyphenyl)-benzidine (MeO-TPD) as a hole injection layer. Layer 1382 has a thickness of 100 nm. Overlying layer 1382 is layer 1380 formed of N,N0-di (naphthalene-1-yl)-N,N0-diphenyl-benzidine as a hole transport layer. Layer 1380 has a thickness of 15 nm.

Overlying layer 1380 is layer 1378 formed of 4,40,400-tri(9-carbazoyl) triphenylamine as an exciton/electron blocking layer. Layer 1378 has a thickness of 5 nm. Overlying layer 1378 is layer 1376 formed of Tris(2-phenylpyridine)iridium(III) as a green emitter Layer 1376 has a thickness of 30 nm. Overlying layer 1376 is layer 1374 formed of bis[2-(2-hydroxyphenyl)-pyridine] beryllium as a host of green emitter and electronic transport layer. Layer 1374 has a thickness of 35 nm. Overlying layer 1374 is layer 1372 formed of LiF as an electron injection layer. Layer 1372 has a thickness of 1 nm. Overlying layer 1372 is an aluminum (Al) electrode 1364 acting as a cathode and having a thickness of 200 nm.

Figure 13D:
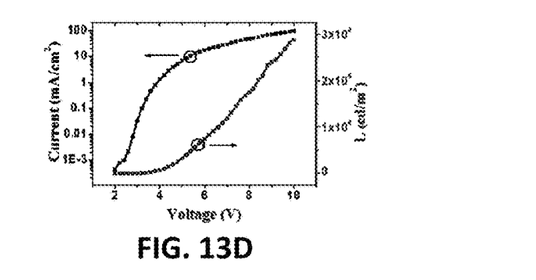
FIG. 13D is a graph of current and light output efficiency as a function of operation voltage for the OLED of FIG. 13C.

The OLED device 1350 of FIG. 13B shows excellent operational performance even under a bent state as shown in FIG. 13C. The current-voltage profile and the luminescence profile of the OLED 1350 built on hybrid substrate 1352 is shown in FIG. 13D. Compared with OLED cells fabricated on glass and plastic (polyethylene naphthalate (PEN)) substrates, OLED cells 1350 with the same structure built on the hybrid substrate 1352 shows an improved current efficiency (i.e., increases of 35-50%) and improved luminescent efficacy (i.e., increases of 5-20%).

Figure 14A:
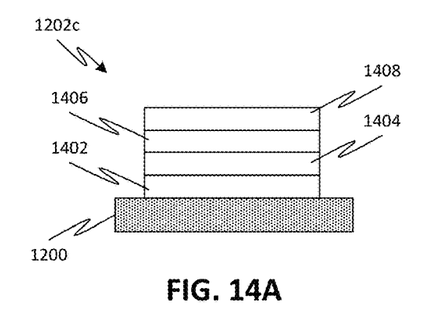
FIG. 14A is a simplified diagram of an assembly including a hybrid substrate and a solar cell as electronic device, according to one or more embodiments of the disclosed subject matter.
Figure 14B:
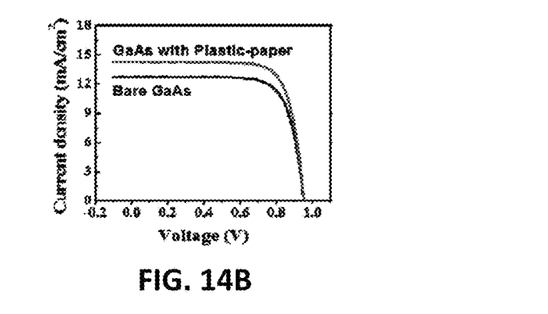
FIG. 14B is a graph of current and voltage profiles of a GaAs solar cell having the structure of FIG. 14A.

FIG. 14A shows another exemplary composite structure where an electronic device 1202c including a solar cell is on a surface of the hybrid substrate 1200. The solar cell can include a bottom electrode layer 1402 (e.g., transparent metal, such as indium tin oxide (ITO)), a hole transport anode 1404 overlying the electrode layer 1402, a photoactive layer 1406 overlying the hole transport anode 1404, and a cathode 1308 (e.g., opaque or transparent metal) overlying the photoactive layer 1406.

For example, the solar cell of FIG. 14A may be a GaAs-based solar cell. In fabrication a GaAs solar cell, the layer by layer growth method, including molecular beam epitaxy (MBE) and metalorganic chemical vapor deposition (MOCVD) or metalorganic vapor phase epitaxy (MOVPE), utilizes a thick GaAs substrate that is usually not less than hundreds of micrometers. Since in a solar cell, only a top 3 μm thick GaAs layer (i.e., active layer) is responsible for the light-electricity conversion, the remainder of the GaAs would be wasted, thus resulting in a significant expense. In order to reduce the material cost, the active layer is transferred to a cheaper substrate following an epitaxial lift-off process. In this manner, the GaAs substrate can be reused for the growth process for multiple solar cells.

In embodiments, the hybrid substrate 1200 is used as this transfer substrate to support the GaAs solar cell. In addition to provide flexibility and being structurally robust, the hybrid substrate 1200 can also offer optical advantages for operation of the GaAs solar cell. In particular, the hybrid substrate 1200 is highly transparent with an extremely high haze. Thus, when illuminated from the side where textile is attached, the hybrid substrate 1200 can function as both a surface scattering layer (i.e., to increase photon travel path) and an index-matching layer (i.e., to act as an anti-reflection coating).

Figure 14C:
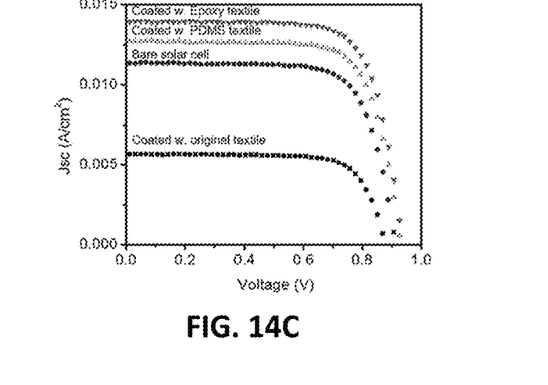
FIG. 14C is a graph of current density of a bare GaAs solar cell (labeled as Bare solar cell), a GaAs solar cell with an overlay of textile as bare substrate (labeled as Coated w. original textile), a GaAs solar cell with an overlay of textile infiltrated with PDMS as hybrid substrate (labeled as Coated w. PDMS textile), and a GaAs solar cell with an overlay of textile infiltrated with epoxy resin as hybrid substrate (labeled as Coated w. Epoxy textile).

In a fabricated embodiment, a hybrid substrate formed of a textile infiltrated with a polymer is directly coated onto the front surface of solar cell. In order to achieve a good adhesion between the solar cell surface and the hybrid substrate, a thin layer of polyvinylpyrrolidone (PVP) was spin coated on the solar cell prior to applying the hybrid substrate. As shown in FIG. 14C, an enhancement of 16% in short circuit density under 1 sun illumination and a corresponding 18% overall conversion efficiency boost can be achieved by the composite structure of the hybrid substrate with GaAs solar cell.

Moreover, the high transparency and high haze of the hybrid substrate allows for broad angle absorption while concurrently increasing coupling length in the solar cell due to broad angle scattering. The broad angle absorption and scattering come from the high haze effect of the hybrid substrate, which is angle insensitive for light transmission. The improved light absorption and coupling leads to increased solar cell efficiency when light is incident from a large angle and may eliminate the need for independent tracking of solar movement. needs for solar tracker. Similarly for OLED lighting devices with reverse light pathways, more light can be coupled out through hybrid substrate due to high haze effect with broad angle transmission ability.

Although reference numeral 1200 in FIGS. 12A-13A and 14A, and reference numeral 1352 in FIG. 13B, have been discussed above as the hybrid substrate, it is also possible that a composite structure including the hybrid substrate (i.e., the bilayer structure of FIG. 11A, the trilayer structure of FIG. 11B, or an otherwise multilayer structure including the hybrid substrate) can be used for reference numerals 1200 and 1352 in FIGS. 12A-13B and 14A, as well as any other contemplated embodiment.

Moreover, although specific examples of an electronic device have been discussed above, embodiments of the disclosed subject matter are not limited to the specific examples. Indeed, other types of electronic devices, such as, but not limited to, electronic displays or photo-electrochemical water splitting devices, can also be coupled to or formed on the hybrid substrate according to one or more contemplated embodiments.

Figure 15:
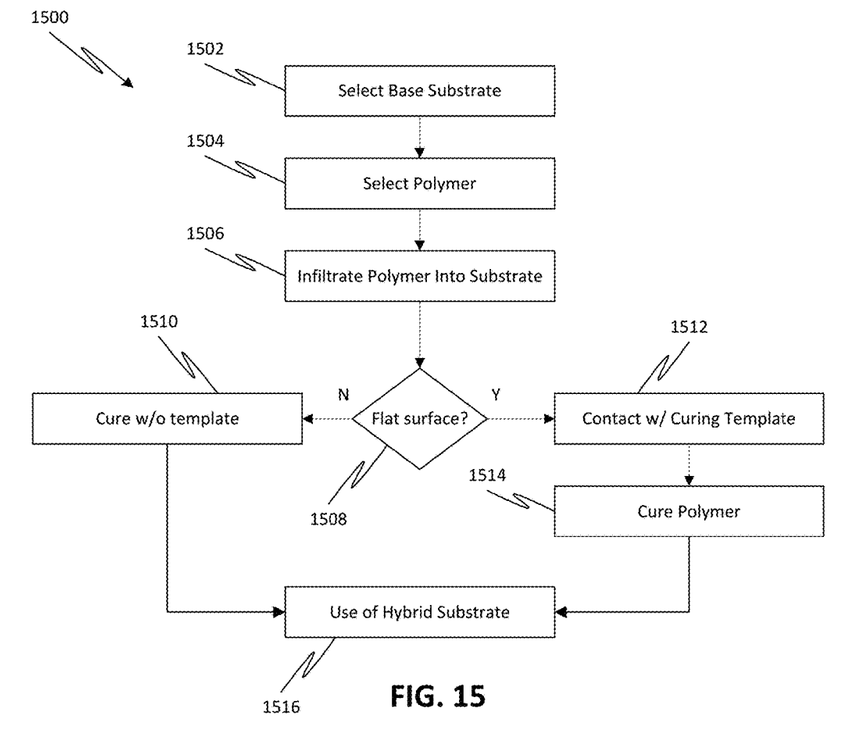
FIG. 15 is a simplified process flow diagram for fabricating a hybrid substrate, according to one or more embodiments of the disclosed subject matter.

Referring to FIG. 15, a process flow diagram 1500 for fabricating and using hybrid substrates according to embodiments of the disclosed subject matter is shown. The process 1500 can begin at 1502 with selection of a base substrate, where the structure and material of the base substrate may impact the mechanical and/or optical properties of the resulting hybrid substrate. Thus, the selection at 1502 may be performed with the end use 1516 of the hybrid substrate in mind.

As noted above, the porous base substrate can be any type of porous material. For example, the base substrate can be formed of a material with randomly arranged (and/or sized) pores within a fibrous matrix, such as, but not limited to paper composed of cellulose fibers, a woven textile composed of natural or artificial fibers, a non-woven textile composed of natural or artificial fibers, an aerogel, a matrix composed of natural or artificial fibers, and a natural wood material. For example, the base substrate can have pores with a size between 10 nm and 100 µm, and a fiber diameter between 1 µm and 100 µm.

Alternatively or additionally, the base substrate can be formed of a material having an ordered arrangement (and/or size) of pores, such as, but not limited to precisely woven textile composed of natural or artificial fibers, a freeze-dried substrate, a 3-D printed substrate, and a micromachined substrate. In some embodiments, the ordered arrangement of pores may be considered to be aligned, i.e., where a series of pores line up to define a substantially contiguous linear path through the base substrate. In such configurations, the ordered arrangement of pores may provide enhanced guiding of light through the hybrid substrate.

In some embodiments, the base substrate may be precisely engineered to have aligned pores, for example, where the pores collaborate to form a series of substantially straight through-holes between surfaces of the base substrate, which alignment may offer certain light guiding advantages once the pores are filled with polymer. For example, the base substrate may have aligned pores and be formed of natural wood, delignified wood, densified wood (i.e., pressed wood), artificial wood, a woven textile, or other porous material. Accordingly, in certain embodiments, 1502 may also include forming of the base substrate.

The process 1500 can proceed to 1504, where selection of an appropriate polymer for infiltration is made, where the material of the polymer may impact the mechanical and/or optical properties of the resulting hybrid substrate. Thus, the selection at 1504 may be performed with the end use 1516 of the hybrid substrate in mind. As noted above, the polymer can be any type of thermosetting or thermoplastic polymer capable of being infiltrated into the pores of the base substrate. For example, the polymer can be epoxy resin, PMMA, PVA, PDMS, PET, PC, or any other transparent plastic.

The process 1500 can proceed to 1506, where the polymer selected in 1504 is infiltrated into the base substrate provided in 1502. For example, the infiltration may be accomplished at room temperature and at ambient pressure. In such configurations, the polymer (or a precursor thereof) may be coated on one or more surfaces of the base substrate. A pressure can optionally be applied to help infuse the polymer fully within the pores of the base substrate. For example, vacuum infiltration of up to 5 mbar can be used.

The process 1500 can proceed to 1508, where it is determined if a surface of the hybrid substrate is desired to be flat (e.g., less than 10 nm surface roughness). As noted above, in some optical applications, having a substantially flat surface for hybrid substrate yields certain performance or fabrication advantages. However, in other applications, the flat surface may not be required. If at 1508 it is determined that a flat surface is not necessary, the process can proceed to 1510 where the polymer is cured in situ within the base substrate without use of a surface template so as to form the hybrid substrate.

Alternatively, if it is determined that a flat surface is desirable at 1508, the process can proceed to 1512, where a surface template is contacted with the desired surface of the polymer infiltrated base substrate, and then cured at 1514 with the template remaining in place under mild pressure to form the hybrid substrate. In embodiments, the surface template is formed of a material selected not to react with or adhere to the polymer or the base substrate. For example, the template may be formed of PDMS cast from a surface of a semiconductor wafer or flat glass substrate. For example, the curing of 1510 or 1514 may occur at a temperature from room temperature (e.g., ~18° C.) up to or exceeding 150° C.

After curing 1510 or 1514, the process 1500 can then proceed to 1516, where the hybrid substrate is adapted for subsequent use. For example, the hybrid substrate may serve as a support for forming an electronic device thereon or may be coupled to a previously fabricated electronic device, as described above.

Figure 16:
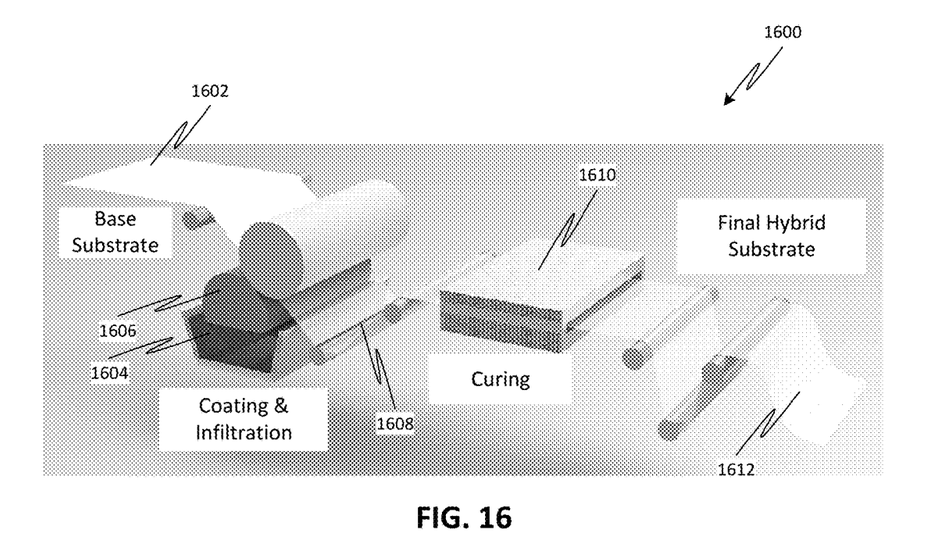
FIG. 16 is a simplified diagram illustrating a roll-to-roll setup for fabricating a hybrid substrate, according to one or more embodiments of the disclosed subject matter.

FIG. 16 illustrates an exemplary fabrication setup 1600 for forming a continuous transparent hybrid substrate employing roll-to-roll processing. A continuous base substrate 1602 from a supply roll (not shown) can be fed to a coating station, where roller 1606 sitting in polymer bath 1604 (or a bath of polymer precursor) acts to coat at least one side of the base substrate with polymer (or polymer precursor). Alternatively or additionally, the base substrate 1602 can be passed through a bath of polymer (or a bath of polymer precursor) at a desired concentration. One or more coating blades 1608 can be used to remove any excess polymer from the base substrate 1602 prior to being dried in oven 1610 to form the final transparent hybrid substrate 1612, which may be wrapped into a storage roll for storage, transport, or subsequent processing.

In some embodiments, a surface template can be provided in the setup 1600 of FIG. 16, for example, in the curing stage, to reduce the surface roughness of the final hybrid substrate. For example, a PDMS plate or platform can be provided to contact and/or press on the coated surfaces of the polymer-infiltrated substrate during curing.

Thus, in embodiments of the disclosed subject matter, transparent hybrid substrates with relatively high haze and potentially super flat surfaces can be achieved. The hybrid substrates can exhibit enhanced optical and mechanical properties, including flexibility, durability, and environmental/chemical resistance. The unique characteristics of the transparent hybrid substrates enable their use as supports for direct fabrication of electronic and optoelectronic devices, while enjoying a comparably lower production cost than other alternatives.

In this application, unless specifically stated otherwise, the use of the singular includes the plural, and the separate use of "or" and "and" includes the other, i.e., "and/or." Furthermore, use of the terms "including" or "having," as well as other forms such as "includes," "included," "has," or "had," are intended to have the same effect as "comprising" and thus should not be understood as limiting.

Any range described herein will be understood to include the endpoints and all values between the endpoints. Whenever "substantially," "approximately," "essentially," "near," or similar language is used in combination with a specific value, variations up to and including 10% of that value are intended, unless explicitly stated otherwise.

The foregoing descriptions apply, in some cases, to examples generated in a laboratory, but these examples can be extended to production techniques. Thus, where quantities and techniques apply to the laboratory examples, they should not be understood as limiting. In particular, where specific chemicals or materials have been disclosed herein, other chemicals and materials may also be employed according to one or more contemplated embodiments.

It is thus apparent that there is provided in accordance with the present disclosure, transparent hybrid substrates, devices employing such substrates, and methods for fabrication and use thereof. Many alternatives, modifications, and variations are enabled by the present disclosure. While specific examples have been shown and described in detail to illustrate the application of the principles of the present invention, it will be understood that the invention may be embodied otherwise without departing from such principles. For example, disclosed features may be combined, rearranged, omitted, etc. to produce additional embodiments, while certain disclosed features may sometimes be used to advantage without a corresponding use of other features. Accordingly, Applicant intends to embrace all such alternative, modifications, equivalents, and variations that are within the spirit and scope of the present invention.

The invention claimed is:

1. A device comprising:
    a hybrid substrate including:
        a base substrate having a plurality of pores therein, the pores being spaces between adjacent structures of the base substrate; and
        a first polymer material filling substantially all of the pores of the base substrate,
    wherein the pores of the base substrate are between 10 nm and 500 µm, inclusive, and
    a dimension of each structure between respective adjacent pores is between 1 µm and 100 µm, inclusive.

2. The device of claim 1, wherein the base substrate comprises at least one of paper composed of cellulose fibers, a woven textile composed of natural or artificial fibers, a non-woven textile composed of natural or artificial fibers, an aerogel, a matrix composed of natural or artificial fibers, a material with aligned pores, and natural wood material.

3. The device of claim 1,
    wherein the first polymer material is different from a material of the base substrate, and
    the first polymer material has a refractive index within 2% of a refractive index of the material of the base substrate.

4. The device of claim 1, wherein at least one of:
    an optical transmittance of the hybrid substrate with respect to light within a wavelength range of 400 nm to 1100 nm, inclusive, is greater than that of the base substrate without the first polymer material, and
    an optical haze of the hybrid substrate with respect to light within the wavelength range of 400 nm to 1100 nm, inclusive, is greater than that of the first polymer material alone.

5. The device of claim 1, wherein an optical transmittance of the hybrid substrate is 80-95% and an optical haze of the hybrid substrate is 50-95%.

6. The device of claim 1, wherein at least one surface of the hybrid substrate has an arithmetic average surface roughness less than 10 nm.

7. The device of claim 1, further comprising:
    an electronic device formed over a surface of the hybrid substrate,
    wherein the electronic device includes at least one of an electronic circuit, a light source, an energy converting device, and an energy storage device.

8. A method comprising:
    (a) providing a base substrate having a plurality of pores therein; and
    (b) filling the pores of the base substrate with a first polymer material to form a hybrid substrate,
    wherein the pores of the base substrate are between 10 nm and 500 µm, inclusive, and
    wherein (b) includes:
        (b1) coating at least one surface of the base substrate with a precursor for the first polymer material; and
        (b2) after (b1), curing to form the hybrid substrate, with the first polymer material infiltrating the base substrate.

9. The method of claim 8, wherein the base substrate comprises at least one of paper composed of cellulose fibers, a woven textile composed of natural or artificial fibers, a non-woven textile composed of natural or artificial fibers, an aerogel, a matrix composed of natural or artificial fibers, a material with aligned pores, and natural wood material.

10. The method of claim 8, wherein the first polymer material has a refractive index within 2% of a refractive index of a material of the base substrate.

11. The method of claim 8, further comprising forming a flat template, wherein the curing of (b2) is performed with the flat template in contact with the at least one surface of the base substrate.

12. The method of claim 11, wherein the flat template comprises a material that does not adhere to the cured first polymer material.

13. The method of claim 8, wherein (b1) comprises passing the base substrate through a bath of the precursor for the first polymer material.

14. The method of claim 8, wherein at least (b1) is performed using a roll-to-roll fabrication setup.

15. The method of claim 8, further comprising, prior to (b2), removing excess precursor from the at least one surface of the base substrate.

16. The method of claim 8, further comprising:
    (c) forming an electronic device over a surface of the hybrid substrate,
    wherein the electronic device includes at least one of an electronic circuit, a light source, an energy converting device, and an energy storage device.

17. The method of claim 16, wherein (c) comprises at least one of:
    transferring a previously fabricated electronic device onto or over the surface of the hybrid substrate; and
    patterning of various layers deposited over the surface of the hybrid substrate to form the electronic device.

18. The method of claim 8, wherein at least one of:
    after (b), an optical transmittance of the hybrid substrate with respect to light within a wavelength range of 400 nm to 1100 nm, inclusive, is greater than that of the base substrate prior to (b), and
    after (b), an optical haze of the hybrid substrate with respect to light within the wavelength range of 400 nm to 1100 nm, inclusive, is greater than that of the first polymer material alone.

19. The method of claim 8, wherein, after (b), an optical transmittance of the hybrid substrate is 80-95% and an optical haze of the hybrid substrate is 50-95%.

20. The device of claim 1,
    wherein the base substrate has a first surface and a second surface opposite the first surface,
    the hybrid substrate includes a first sublayer formed on the first surface of the base substrate and a second sublayer formed on the second surface of the base substrate,
    the first and second sublayers consist essentially of the first polymer material and each have a thickness less than 10 µm.

* * * * *